(12) United States Patent
Blish, II et al.

(10) Patent No.: US 6,294,923 B1
(45) Date of Patent: *Sep. 25, 2001

(54) METHOD AND SYSTEM FOR DETECTING FAULTS UTILIZING AN AC POWER SUPPLY

(75) Inventors: Richard C. Blish, II, Saratoga; J. Courtney Black, San Jose; Mohammad Massoodi, Campbell, all of CA (US)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/208,801

(22) Filed: Dec. 7, 1998

(51) Int. Cl.⁷ ............................. G01R 31/28; G01R 31/311
(52) U.S. Cl. ................................. 324/765; 324/750
(58) Field of Search ...................... 324/765, 501, 324/750, 158.1; 250/334, 338.1, 341.6

(56) References Cited

U.S. PATENT DOCUMENTS

| | | | |
|---|---|---|---|
| 3,463,007 | * 8/1969 | Jones et al. | 324/501 |
| 3,803,413 | * 4/1974 | Vanzetti et al. | 250/338.1 |
| 3,868,508 | * 2/1975 | Lloyd | 250/338.1 |
| 3,991,302 | * 11/1976 | Danner | 324/501 |
| 4,792,683 | * 12/1988 | Chang et al. | 250/334 |
| 5,208,528 | * 5/1993 | Quintard | 250/338.1 |

* cited by examiner

Primary Examiner—Ernest Karlsen
(74) Attorney, Agent, or Firm—Sawyer Law Group LLP

(57) ABSTRACT

A system and method for detecting a position of a short in a semiconductor device is disclosed. The semiconductor device includes a semiconductor die and a substrate. The method and system include supplying alternating power to the semiconductor device. The method and system further include sensing a plurality of synchronous temperature variations in proximity to a surface of the semiconductor die while power is supplied to the semiconductor die.

9 Claims, 5 Drawing Sheets

METHOD AND SYSTEM FOR DETECTING FAULTS UTILIZING AN AC POWER SUPPLY

FIELD OF THE INVENTION

The present invention relates to fault detection in semiconductor devices and more particularly to a method and system for detecting a position of a short utilizing AC power applied to the integrated circuit, thereby providing a more accurate indication of the location of shorts in the semiconductor die.

BACKGROUND OF THE INVENTION

Semiconductor devices typically include a semiconductor die mounted to a substrate. The die includes an active area in which circuitry is formed. The circuitry in the active area is electrically coupled to the substrate using connections at the surface of the active area. In a conventional device, the die is mounted so that the active area faces up, away from the substrate. In a flip-chip device, the die is mounted so that the active area is down, in proximity to the substrate.

In either conventional or flip-chip devices, detection of faults after fabrication of the semiconductor device is desirable. One such fault is a short. Both the existence of the fault and the position of the fault are desired to be determined. In conventional packages, shorts and other faults which generate heat may be detected using a liquid crystal. A thin layer of liquid crystal is poured over the circuits at the top of the die. When power is applied to the die, the liquid crystal changes phase over some hot spots in the circuits. Due to the phase change, the opacity and/or polarization of the liquid crystal changes over the hot spots. The centers of areas where the liquid crystal has changed phase mark the locations of shorts in the circuit. Consequently, the position of shorts in the circuit can be detected.

Although conventional liquid crystal detection can be used for circuits in conventional devices, this method has several drawbacks. Liquid crystal detection is primarily useful where the short is near a readily accessible surface. If the short is buried, heat is dissipated too rapidly with lateral distance within the semiconductor die for the liquid crystal to change phase. As a result, liquid crystal detection may not detect shorts in flip-chip devices or other cases in which the short is not very close to the surface on which the liquid crystal is placed. Conventional liquid crystal detection also biases the semiconductor die such that areas far from a short are below the temperature of the liquid crystal phase transition, while the short is above the temperature of the liquid crystal phase transition. This may be difficult or time consuming to accomplish. Finally, liquid crystal is carcinogenic. Consequently, health precautions must be taken during use of the liquid crystal.

Accordingly, what is needed is a system and method for detecting the positions of faults within a flip-chip device. The present invention addresses such a need.

SUMMARY OF THE INVENTION

The present invention provides a system and method for detecting a position of a short in a semiconductor device. The semiconductor device includes a semiconductor die and a substrate. The method and system include supplying alternating power to the semiconductor device. The method and system further include sensing a plurality of synchronous temperature variations in proximity to a surface of the semiconductor die while power is supplied to the semiconductor die.

According to the system and method disclosed herein, the present invention correlates temperature variations due to the synchronously alternating power supply and, therefore, the fault can be more readily detected. Thus, the ability to accurately detect shorts is improved.

DETAILED DESCRIPTION OF THE INVENTION

The present invention relates to an improvement in detection of faults in semiconductor devices, including flip-chip devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
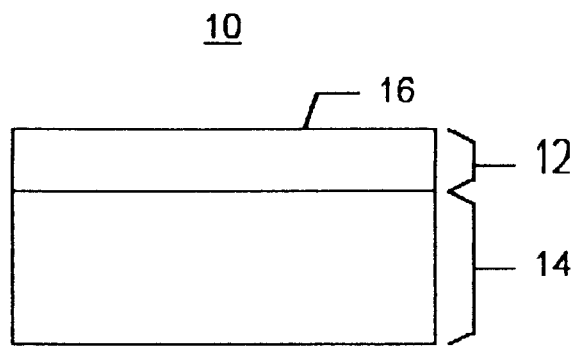
FIG. 1 is a diagram of a semiconductor die.

FIG. 1 is a block diagram of a conventional semiconductor die 10. Typically, the semiconductor used is silicon. The die 10 includes an active area 12 in which circuits (not shown) are formed. The surface 16 of the active area 12 is typically considered the top of the die 10. The die 10 also includes a second portion 14 under the active area 12. This second portion 14 will be referred to as the inactive area. The inactive area 14 is significantly thicker than the active area 12 m which the circuits are formed.

Figure 2A:
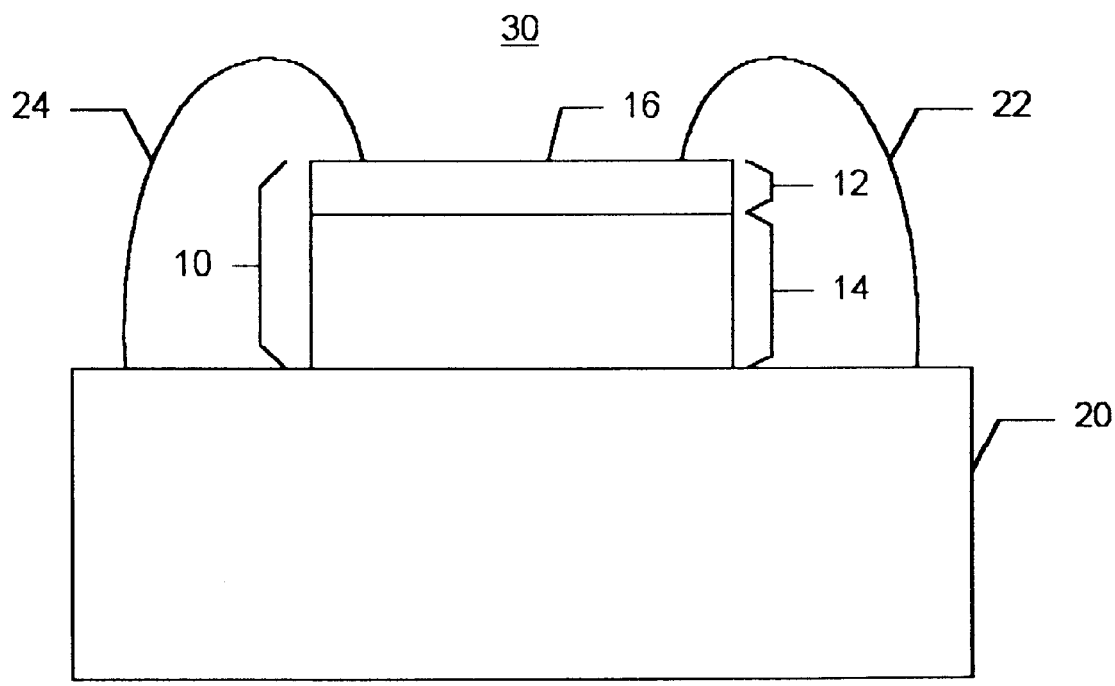
FIG. 2A is a diagram depicting side view of a conventional device.
Figure 2B:
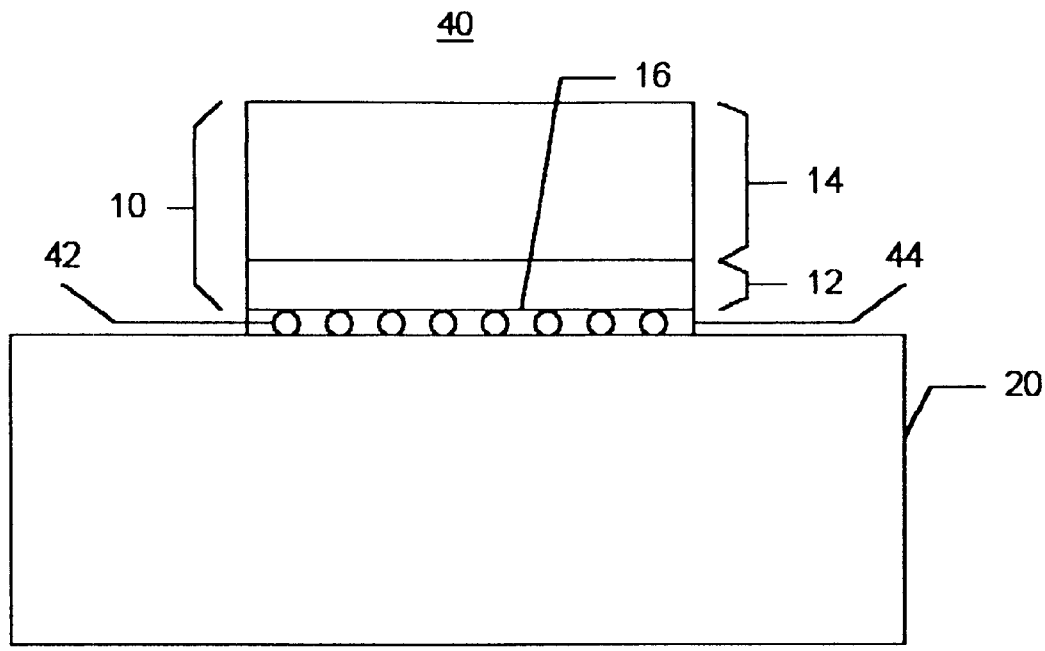
FIG. 2B is a diagram of side view of a flip-chip device.

FIGS. 2A and 2B depict semiconductor devices. FIG. 2A depicts a conventional device 30. The conventional device 30 includes a semiconductor die 10 mounted on a substrate 20. The die 10 is mounted so that the surface 16 is face up, away from the substrate 20. The bottom of the inactive area 14 contacts the substrate 20. Leads 22 and 24 electrically connect the circuits in the active area 12 of the die 10 to the wiring in the substrate 20. FIG. 2B depicts a flip-chip device 40. In the flip-chip device 40, the die 10 is mounted with the active area 12 face down. The surface 16 of the active area is in close proximity to the substrate 20. Electrical contact between the circuits in the active area 12 and the substrate 20 is made via solder balls 42. The die 10 is fixed to the substrate 20 using underfill 44 which also fills in gaps between the solder balls 42.

It is often desirable to examine the conventional device 30 and the flip-chip device 40 for faults such as junction shorts, metal shorts, or junction breakdowns in the circuits on the active area 12. Typically these faults generate heat during operation of the circuits on the die 10. In addition to detecting the existence of such faults within the circuits, the positions of the faults should be determined.

Figure 3:
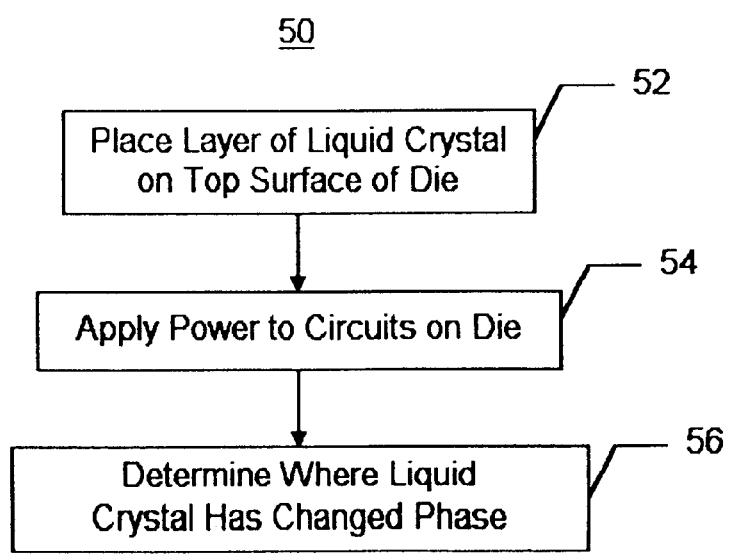
FIG. 3 is a flow chart depicting a conventional method of detecting faults in a conventional device.

FIG. 3 is a flow chart depicting a conventional method 50 (prior art) for detecting faults in circuits in the conventional device 30. A thin layer of a liquid crystal (not shown) is placed on the top surface of the die 10 via step 52. Thus, the liquid crystal is placed on the surface 16 of the active area 12 in step 52. The liquid crystal is in proximity to the circuits in the active area 12 of the die 10. Power is then applied to the circuits in the active area of the die 10, via step 54. Power is applied to the die 10 such that portions of the die 10 not having a fault are at a temperature just below a temperature at which the liquid crystal undergoes a phase transition. In areas where a short, junction breakdown, or other heat generating fault exists, the surface of the die 10 will be at least at the temperature at which the liquid crystal undergoes a phase transition. The phase transition causes the liquid crystal to change opacity. Thus, it is determined via step 56 where the liquid crystal has changed phase. These areas mark the position of faults such as shorts. Thus, the existence and position of faults can be determined.

Although the method 50 depicted in FIG. 3 can detect some faults in conventional devices 30, those with ordinary skill in the art will realize that the method 50 cannot detect faults where the fault is relatively far from the surface on which the liquid crystal is placed. For example, the active area 12 is not exposed in the flip-chip device 40. To use the method 50, liquid crystal will be poured on a surface of the inactive area 14. The inactive area 14 is significantly thicker than the active area 12 and readily distributes heat generated in the active area 12 by diffusion. The liquid crystal may not change phase only in areas near faults. Thus, the method 50 cannot detect faults in a flip-chip device or in other cases when the fault is relatively far from the surface on which the liquid crystal is poured.

One of ordinary skill in the art will also realize that even if the method 50 can be used to detect the existence of faults, conventional liquid crystal detection is difficult to perform. To ensure that shorts are detectable, the semiconductor die 10 is biased such that areas away from a short are below the temperature of the liquid crystal phase transition. However, the die 10 is also biased such that a short will drive the temperature of the surrounding area above the temperature of the liquid crystal phase transition, allowing the short to be detected. This biasing may be difficult or time consuming to accomplish.

Furthermore, one of ordinary skill in the art will readily realize that common liquid crystals used in the method 50 are carcinogens. Thus, the method 50 may be hazardous to the health of an investigator using the method 50. Accordingly, a less dangerous method of detecting faults in the flip-chip device 40 would also be beneficial.

The present invention provides a system and method for detecting a position of a short in a semiconductor device. The semiconductor device includes a semiconductor die and a substrate. The method and system include supplying alternating power to the semiconductor device. The method and system further include sensing a plurality of temperature variations in proximity to a surface of the semiconductor die while power is supplied to the semiconductor die.

The present invention will be described in the context of locating particular faults which generate heat. Thus, the present invention will be described in the context of detecting the location of shorts. However, one of ordinary skill in the art will readily recognize that this method and system will operate effectively for other types of analysis where AC power can be supplied to a semiconductor die and where the phenomenon being investigated generate heat at a predictable frequency.

Figure 4A:
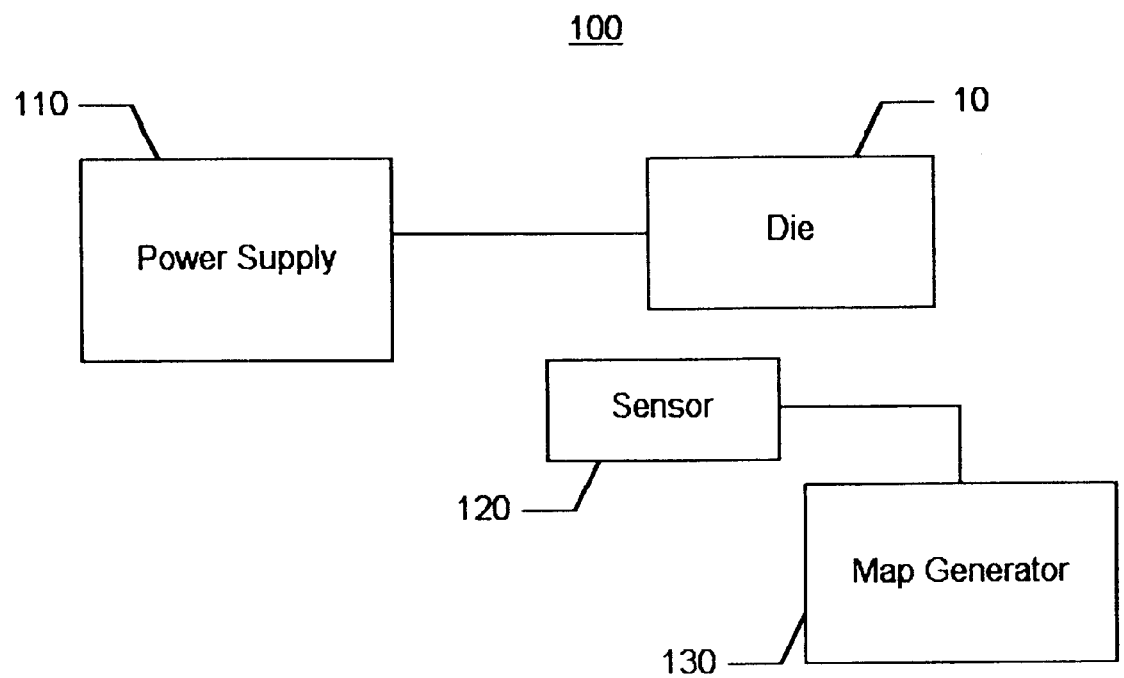
FIG. 4A is a block diagram of a system for detecting faults with an alternating power supply in accordance with the present invention.

To more particularly illustrate the method and system in accordance with the present invention, refer now to FIG. 4A depicting a block diagram of one embodiment of such a system 100. The system 100 includes an AC power supply 110 coupled with the semiconductor die 10 of the conventional device 30 or the flip-chip package 40. The power supply 110 provides an AC signal superimposed on a DC bias. Thus, the AC power supply 110 could be viewed as providing a modulated signal to the die 10. The AC power supply 110 is used to drive circuitry in the active area 12 of the die 10. The system 100 also includes a sensor 120 coupled with a map generator 130. The sensor 120 senses variations in temperature in the die 10. The map generator 130 may include a computer which is capable of both storing data and generating a map.

Figure 4B:
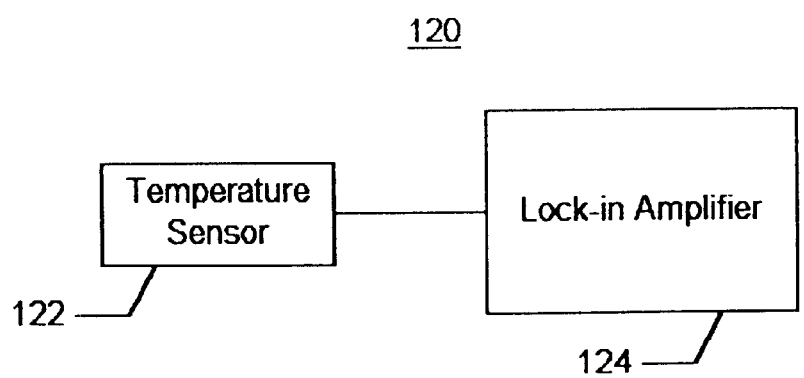
FIG. 4B is a block diagram of a temperature sensor in accordance with the present invention.

FIG. 4B depicts one embodiment of the sensor 120. The sensor 120 includes a temperature sensor 122 coupled with a lock-in amplifier 124. Because the temperature sensor 122 is coupled with the lock-in amplifier 124, the sensor 120 will sense variations in temperature only near a frequency selected on the lock-in amplifier. In a preferred embodiment, this frequency is near the frequency of the AC power supply 110. Although the function of the temperature sensor 122 is to sense temperature, this could be accomplished in a variety of ways. In one embodiment, the temperature sensor 122 detects infrared radiation emitted by the die 10. Because the temperature sensor 122 is coupled to the lock-in amplifier 124, the sensor 120 only detects infrared radiation emitted at the frequency selected by the lock-in. In a preferred embodiment, this frequency is near the frequency of the AC power supply 110. Thus, detection of variations in temperature in the die 10 at other frequencies will be suppressed by the sensor 120.

Figure 5:
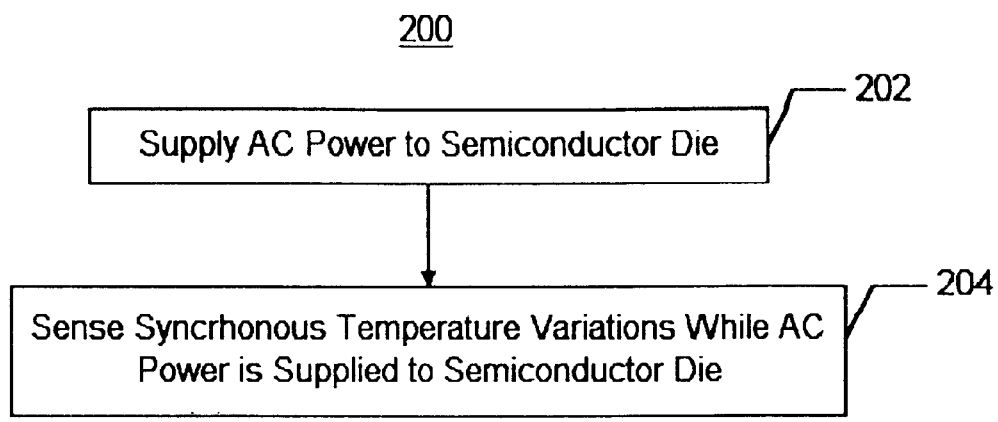
FIG. 5 is a flow chart of a method for generating a temperature contour map of a semiconductor die in accordance with the present invention.

FIG. 5 depicts one embodiment of a method 200 for detecting faults in accordance with the present invention. AC Power is supplied to circuits in the semiconductor die 10 using the AC power supply 110, via step 202. Preferably, AC power is supplied at a frequency away from any normal operating frequencies for the circuits (not shown) in the die 10. In one embodiment, power is supplied at a frequency on the order of 9 Hertz. While power is applied to circuits in the die 10, variations in temperature are sensed across the die 10 using the sensor 120, via step 204. In a preferred embodiment, the variations in temperature are selectively sensed to discriminate for variations due to the fault For example, variations which track the rate at which power is supplied to the die 10 by the AC power supply 110 can be considered to be generated by shorts. Thus, temperature variations which are at the frequency at which power is supplied may be selectively sensed in step 204. Thus, shorts can relatively easily be detected. The use of the carcinogenic liquid crystal and the need to carefully bias the temperature of the die 10 may thus be avoided.

Figure 6:
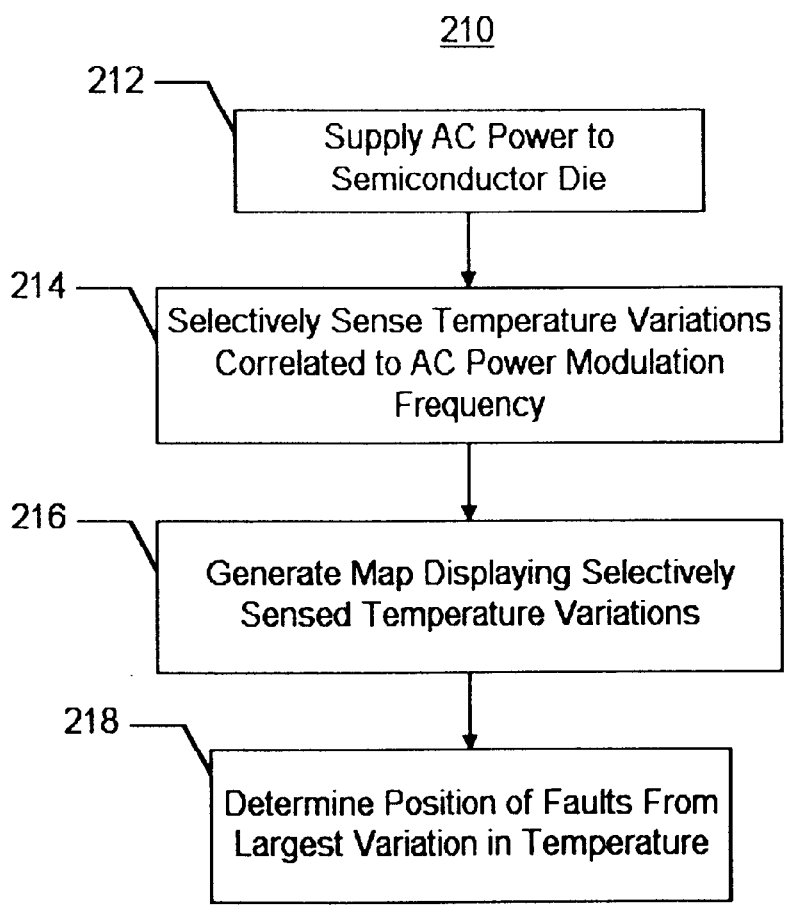
FIG. 6 is a more detailed flow chart of a method for generating a temperature contour map of a semiconductor die in accordance with the present invention.

FIG. 6 depicts a more detailed flow chart of one embodiment of a method 210 in accordance with the present invention. AC Power is supplied to circuits in the semiconductor die 10 using AC power supply 110, via step 212. In a preferred embodiment, AC power is supplied at a particular frequency which is far from the operating frequency of the circuitry (not shown) in the die 10. In addition, a higher power signal can be applied to the die in step 212 to provide higher temperature variation. Providing higher power to the die 10 allows for more sensitive detection of faults in the die 10. While power is applied to circuits in the die 10, variations in temperature are selectively sensed using the sensor 120, via step 214. The variations which are sensed are preferably those which are in a range around the particular frequency that power is applied to the die 10. Therefore, variations in temperature which are not related to shorts may be screened from being sensed in the step 214.

Via step 216, a map is then generated from the variations in temperature sensed in step 214. In a preferred embodiment, the map depicts the areas of the die 10 where temperature varies substantially only at the frequency at which the AC power supply 110 supplies power to the die 10. The faults are then detected, via step 218. Shorts generate variations which track the rate at which power is supplied to the die 10. Thus, the faults are detected by determining the positions of the largest variations in temperature that track the frequency at which power is supplied to the circuit.

Figure 7:
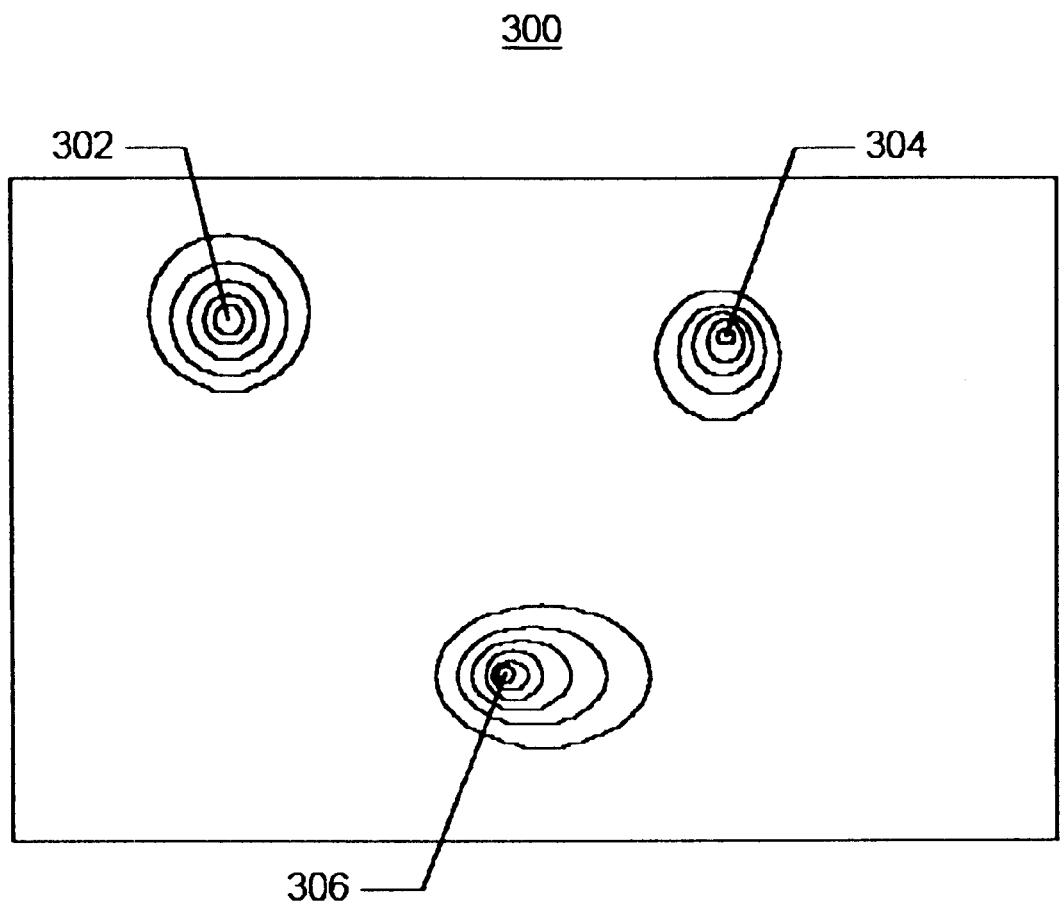
FIG. 7 is a diagram of a map of temperature variations generated in accordance with the present invention.

FIG. 7 depicts a contour map 300 of temperature variations in the die 10 generated in accordance with the present invention. Larger temperature variations are indicated by contour lines which are closer together. Thus, the map 300 depicts faults 302, 304, and 306. Using the map 300, the positions of the faults 302, 304, and 306 can be determined in step 218.

Thus, the system 100 and method 200 can sense temperature variations which can be correlated with shorts or other faults. The system 100 and method 200 may discriminate between temperature variations due to shorts or other faults and temperature variations due to other phenomenon. In one embodiment, this discrimination is provided by driving the die 10 at a particular frequency and sensing variations in temperature which are in a range around the particular frequency. In addition, because temperature variations in response to an AC power supply are sensed, the temperature variations can be sensed before the heat generated by a short has dissipated. Thus, the faults can be detected even when not located in proximity to a surface of the die 10. The complex biasing scheme and carcinogenic materials of the conventional fault detection method may also be avoided.

A method and system has been disclosed for detection of faults in a semiconductor die. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for detecting a position of a short in a semiconductor device including a semiconductor die and a substrate, the semiconductor die having at least one power terminal through which an active area in the semiconductor die can be powered, the method comprising the steps of:
   (a) supplying alternating power to the semiconductor device via the at least one power terminal;
   (b) sensing a plurality of synchronous temperature variations in proximity to a surface of the semiconductor die while alternating power is supplied to the semiconductor die, wherein a portion of the plurality of synchronous temperature variations is due to the short and wherein sensing further includes selectively sensing the portion of the plurality of variations;
   (c) detecting the position of the short from the portion of the plurality of synchronous temperature variations sensed, the position of the short being in proximity to the portion of the plurality of synchronous temperature variations; and
   (d) generating a thermal contour map of the plurality of synchronous temperature variations sensed in step (b).

2. The method of claim 1 wherein the alternating power supplying step (a) further includes the step of:
   (a1) supplying alternating power to the semiconductor device at a first frequency.

3. The method of claim 2 wherein the synchronous temperature variation sensing step (b) further includes the step of:
   (b2) sensing the plurality of synchronous temperature variations at at least a second frequency, the second frequency being substantially the same as the first frequency.

4. The method of claim 3 wherein the at least second frequency further includes a range of frequencies, the range of frequencies including the first frequency.

5. A system for detecting a position of a short in a semiconductor device including a semiconductor die and a substrate, the semiconductor die having at least one power terminal through which an active area in the semiconductor die can be powered, the system comprising:
   an alternating power supply coupled to the semiconductor device via the at least one power terminal;
   a sensor for sensing a plurality of synchronous temperature variations in proximity to a surface of the semiconductor die while alternating power is supplied to the semiconductor die, wherein a portion of the plurality of synchronous temperature variations is due to the short and wherein the sensor further includes:
      means for selectively sensing the portion of the plurality of variations; and
      means for generating a thermal contour map of the plurality of synchronous temperature variations.

6. The system of claim 5 wherein the alternating power supply further supplies alternating power to the semiconductor device at a first frequency.

7. The system of claim 6 wherein the sensor further includes:
   a lock-in amplifier for sensing the plurality of synchronous temperature variations at a range of frequencies, the range of frequencies including the first frequency; and
   at least one temperature sensor coupled to the lock-in amplifier.

8. The system of claim 7 wherein the temperature sensor further includes:
   means for detecting variations in infrared light emitted from the semiconductor die.

9. The system of claim 5 further comprising:
   means for storing data relating to the plurality of synchronous temperature variations.

* * * * *